(12) United States Patent
Lin et al.

(10) Patent No.: US 6,849,942 B2
(45) Date of Patent: Feb. 1, 2005

(54) SEMICONDUCTOR PACKAGE WITH HEAT SINK ATTACHED TO SUBSTRATE

(75) Inventors: Chang-Fu Lin, Taichung (TW);
Han-Ping Pu, Taichung (TW);
Cheng-Hsu Hsiao, Taichung (TW);
Chien Ping Huang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/438,463

(22) Filed: May 14, 2003

(65) Prior Publication Data

US 2004/0178494 A1 Sep. 16, 2004

(30) Foreign Application Priority Data

Mar. 11, 2003 (TW) .......................... 92105167 A

(51) Int. Cl.[7] .............................................. H01L 23/34
(52) U.S. Cl. ...................... 257/712; 257/713; 257/717; 257/723; 257/718; 257/706
(58) Field of Search ................................ 257/712, 713, 257/717, 718, 719, 723, 724, 706, 701

(56) References Cited

U.S. PATENT DOCUMENTS

| | | | |
|---|---|---|---|
| 5,311,402 A | 5/1994 | Kobayashi et al. | 361/760 |
| 5,396,403 A | 3/1995 | Patel | 361/705 |
| 5,637,920 A | 6/1997 | Loo | 257/700 |
| 5,926,371 A | 7/1999 | Dolbear | 361/704 |
| 5,931,222 A | 8/1999 | Toy et al. | 165/80.3 |
| 6,011,304 A | 1/2000 | Mertol | 257/706 |
| 6,093,961 A | 7/2000 | McCullough | 257/718 |
| 6,130,821 A * | 10/2000 | Gerber | 361/704 |
| 6,504,723 B1 * | 1/2003 | Fitzgerald et al. | 361/705 |
| 6,656,770 B2 * | 12/2003 | Atwood et al. | 438/118 |

* cited by examiner

Primary Examiner—Nathan J. Flynn
Assistant Examiner—Remmon R. Fordé
(74) Attorney, Agent, or Firm—Peter F. Corless; Steven M. Jensen; Edwards & Angell, LLP

(57) ABSTRACT

A semiconductor package with a heat sink is provided in which at least one chip is mounted on the substrate and covered by a heat sink. The heat sink is formed with a flange in contact with the substrate, allowing a plurality of clip members to clamp the flange of the heat sink and the substrate. Each of the clip members has a recess portion for receiving the flange of the heat sink and the substrate to thereby firmly position the heat sink on the substrate. The clip members are engaged with edges of the heat sink and the substrate, thereby not affecting trace routability on the substrate. Moreover, the heat sink is mounted on the substrate and would not be dislocated.

11 Claims, 3 Drawing Sheets

US 6,849,942 B2

SEMICONDUCTOR PACKAGE WITH HEAT SINK ATTACHED TO SUBSTRATE

FIELD OF THE INVENTION

The present invention relates to semiconductor packages, and more particularly, to a semiconductor package with a heat sink for improving heat dissipating efficiency of the semiconductor package.

BACKGROUND OF THE INVENTION

A FCBGA (flip-chip ball grid array) semiconductor package is formed with both a flip-chip structure and a ball grid array in which at least one chip is mounted and electrically connected to a surface of a substrate by a plurality of solder bumps, and a plurality of solder balls are implanted on an opposite surface of the substrate to serve as input/output (I/O) connections of the semiconductor package. In order to dissipate heat produced from operation of the chip, a heat sink is normally incorporated in the semiconductor package, as disclosed by U.S. Pat. Nos. 5,311,402, 5,637,920, 5,931,222 and 6,011,304. This heat sink is attached to the substrate by means of an adhesive or solder and is usually greater in surface area than the chip to cover the chip and effectively dissipate the heat from the chip. Further, as to enhance electrical performances of the semiconductor package, at least one passive component can be mounted on the substrate, which however would decrease area on the substrate capable of being in contact with the heat sink, thereby making the heat sink relatively difficult to be firmly adhered and positioned onto the substrate and thus leading to dislocation of the heat sink; this situation becomes severe in the use of a large heat sink. Moreover, attachment between the heat sink and the substrate via the adhesive or solder would be damaged by unsatisfactory cleanness of contact surfaces between the heat sink and the substrate, or by undesirable stress applied to the heat sink and the substrate; in this case, delamination may occur at an interface between the heat sink and the substrate, and as a result, the heat sink is dislocated. Furthermore, when the substrate mounted with the heat sink is subject to external force such as vibration or shock, the heat sink may also be dislocated from the substrate.

Therefore, it has been taught to mount a heat sink on a chip or to mechanically secure a heat sink on a substrate in position. The former is illustrated by U.S. Pat. No. 6,093,961; as shown in FIG. 5, a heat sink 22 is directly stacked on and coupled to a flip chip 21 on a substrate 20; the heat sink 22 is formed with a plurality of flexible legs 23 extending toward the chip 21, each leg 23 having a hook end 230. When the heat sink 22 is pressed on an upper surface 210 of the chip 21, the hook ends 230 of the flexible legs 23 are adapted to be engaged with corners of a lower surface 211 of the chip 21 to securely dispose the heat sink 22 onto the chip 21. However, this structure is defective that the chip may be damaged if improperly pressing the heat sink onto the chip; further, during a high temperature process or thermal cycle, due to mismatch in coefficient of thermal expansion (CTE) between the heat sink and the chip, the chip may suffer thermal stress and crack.

U.S. Pat. Nos. 5,396,403 and 5,926,371 propose to position the heat sink on the substrate in a mechanical manner that the heat sink is formed with a plurality of holes at positions supposed to be in contact with the substrate that is also formed with a plurality of corresponding holes, and a plurality of fixing members such as bolts are coupled to the holes to connect the heat sink and the substrate. However, this mechanical method of attaching the heat sink onto the substrate renders significant problems. One is that predetermined area on the substrate is required for forming the holes, which may affect trace routability on the substrate and make the substrate not able to be mounted with a full array of solder balls. Besides, formation of the holes would undesirably increase fabrication costs and process complexity of the substrate. Further, external moisture or contaminant may enter the holes of the substrate and thus degrade reliability of fabricated products.

Therefore, the problem to be solved herein is to securely position a heat sink on a substrate without leading to dislocation of the heat sink, damaging a chip mounted on the substrate or affecting trace routability on the substrate.

SUMMARY OF THE INVENTION

An objective of the present invention is to provide a semiconductor package with a heat sink, wherein a plurality of clip members are used to clamp a substrate and a heat sink mounted on the substrate so as to firmly secure the heat sink on the substrate in position.

Another objective of the invention is to provide a semiconductor package with a heat sink, wherein a heat sink is mounted on a substrate without causing cracks of a chip mounted on the substrate.

A further objective of the invention is to provide a semiconductor package with a heat sink, wherein a heat sink is attached to a substrate by means of a plurality of clip members which would not affect trace routability or solder ball arrangement on the substrate.

In accordance with the foregoing and other objectives, the present invention proposes a semiconductor package with a heat sink, including: a substrate having an upper surface and a lower surface opposed to the upper surface; at least one chip mounted on the upper surface of the substrate and electrically connected to the substrate by a plurality of conductive elements; a heat sink mounted on the upper surface of the substrate and covering the chip, the heat sink having a flat portion and a support portion extending from an edge of the flat portion to the substrate, making the flat portion elevated above the chip by the support portion, wherein the support portion is formed with a flange in contact with the upper surface of the substrate; a plurality of clip members each having a recess portion for allowing the flange of the heat sink and the substrate to be received within the recess portion and clamped by the clip members so as to firmly position the heat sink on the substrate; and a plurality of solder balls implanted on the lower surface of the substrate.

The above semiconductor package yields significant benefits in the use of a plurality of flexible clip members to clamp the substrate and the flange of the heat sink mounted on a surface of the substrate so as to secure the heat sink on the substrate in position. The edge of the substrate and/or the edge of the flange is formed with a plurality of grooves to be engaged with the clip members, such that the substrate and the heat sink can be clamped by the clip members. Moreover, the grooves of the substrate are preferably situated at positions corresponding to space between adjacent solder balls (implanted on a surface of the substrate opposite to the substrate mounted with the heat sink), thereby not affecting arrangement of the solder balls or ball pads (where the solder balls are bonded) on the substrate, and thus making the substrate capable of being mounted with a full array of solder balls. This method of positioning the heat sink on the substrate can eliminate chip cracks caused by directly coupling the heat sink onto the chip as in the prior art. Further, compared to the prior art of using fixing members (such as bolts) for attaching the heat sink to the substrate in which the heat sink and the substrate are formed with holes for being engaged with the fixing members, this feature of hole formation is not required in the semiconductor package according to the invention and thus trace routability on the substrate would not be affected. And, the grooves formed at the edge of the substrate only need to be dimensioned sufficiently to receive the clip members, thereby leading to much less damage to the substrate as compared to formation of holes on the substrate. In addition, the substrate free of holes can prevent damage from external moisture or contaminant entering into the holes and thereby eliminates the reliability issues to the semiconductor package.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The preferred embodiments of a semiconductor package with a heat sink proposed in the present invention are described with reference to FIGS. 1, 2A–2C, 3 and 4.

First Preferred Embodiment

Figure 1:
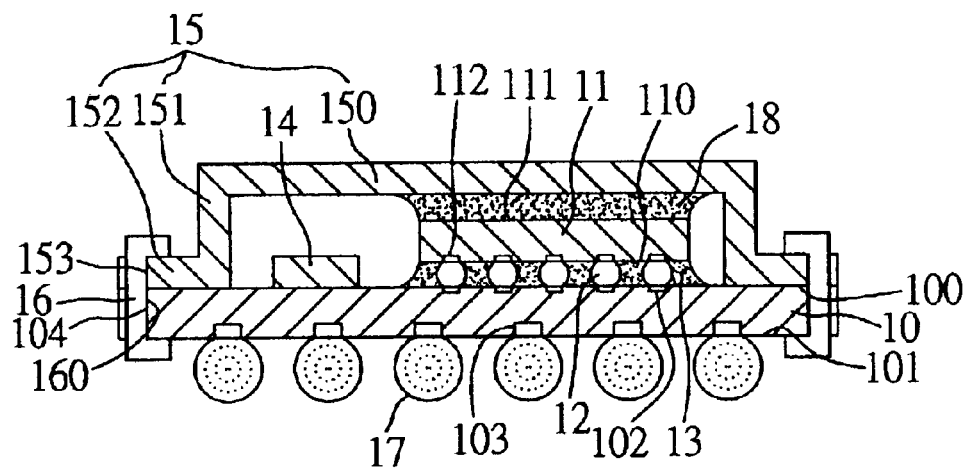
FIG. 1 is a cross-sectional view of a semiconductor package according to a first preferred embodiment of the invention.

FIG. 1 illustrates a semiconductor package according to a first preferred embodiment of the invention. As shown in the drawing, this semiconductor package uses a substrate 10 as a chip carrier primarily made of a conventional resin material such as epoxy resin, polyimide resin, BT (Bismaleimide Triazine) resin, FR4 resin, etc.

The substrate 10 has an upper surface 100 and a lower surface 101 opposed to the upper surface 100. The upper surface 100 of the substrate 10 is formed with a plurality of bond pads 102 at predetermined positions where solder bumps 12 are bonded, and the lower surface 101 of the substrate 10 is formed with a plurality of ball pads 103 for being implanted with solder balls 17. The substrate 10 is fabricated by conventional processes which are not to be further detailed herein.

Figure 2A:
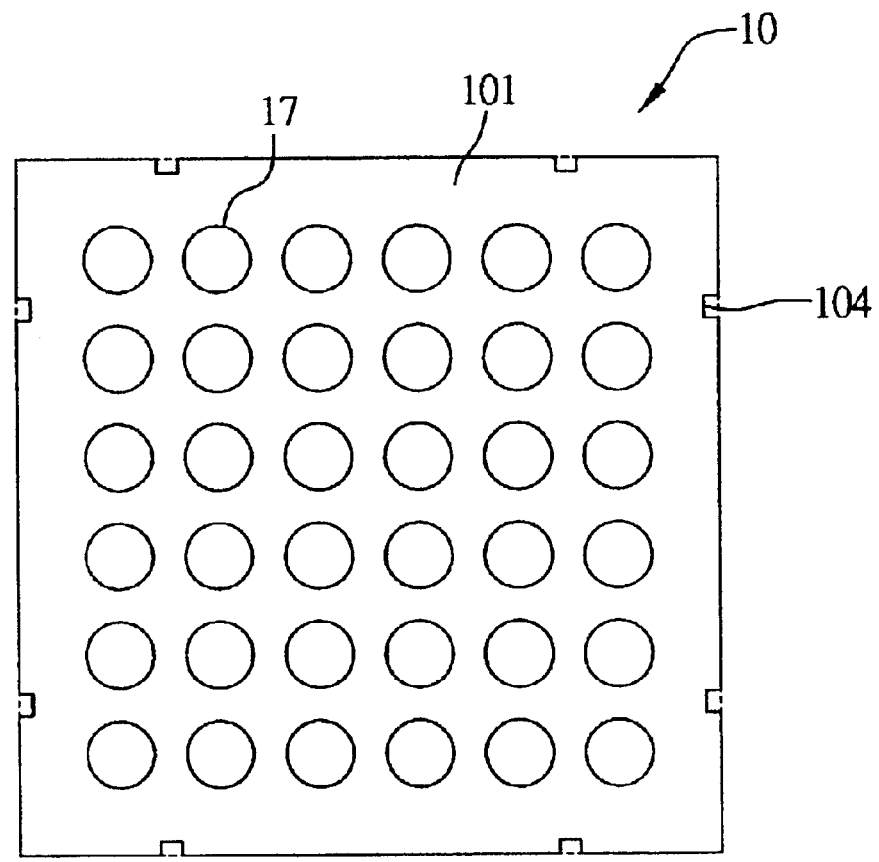
FIG. 2A is a bottom view of a substrate used in the semiconductor package according to the invention.

As shown in FIG. 2A, an edge of the substrate 10 is formed at predetermined positions with a plurality of inwardly recessed grooves 104 penetrating through the upper and lower surfaces 100, 101 of the substrate 10. The grooves 104 are preferably situated at positions corresponding to space between adjacent solder balls 17, and have a width slightly smaller than a distance between adjacent solder balls 17. A depth of the grooves 104 is preferably slightly larger than thickness of clip members 16 used for clamping a heat sink 15 and the substrate 10 (to be detailed later), so as to allow the clip members 16 to be accommodated within the grooves 104.

At least one chip 11 is prepared, having an active surface 110 where electronic elements and circuits (not shown) are disposed and a non-active surface 111 opposed to the active surface 110. The active surface 110 of the chip 11 is formed with a plurality of bond pads 112 corresponding in position to the bond pads 102 of the substrate 10, so as to allow the active surface 110 of the chip 11 to be electrically connected to the upper surface 100 of the substrate 10 by means of a plurality of solder bumps 12 whose two ends are respectively bonded to the bond pads 102, 112. The use of solder bumps for mediating chip-substrate electrical connection is customarily named flip-chip technology, which can beneficially shorten the electrical connection pathway between the chip and the substrate and thereby assure quality of electrical performances.

It is preferable to apply an insulating material 13 (such as resin, etc.) between the chip 11 and the substrate 10 to fill gaps between adjacent solder bumps 12 and thus encapsulate the solder bumps 12 so as to enhance bondability between the chip 11 and the substrate 10. This gap-filling method is customarily referred to as underfill technology, which can be performed by dispensing the insulating material and allowing the insulating material to fill the gaps between adjacent solder bumps by virtue of capillarity; the underfill technology is well known in the art and not to be further described herein.

Moreover, optionally at least one passive component 14 (such as capacitor, etc.) can be mounted on the upper surface 100 of the substrate 10 at area free of the solder bumps 12 or chip 11 to improve electrical performances of the semiconductor package.

Figure 2B:
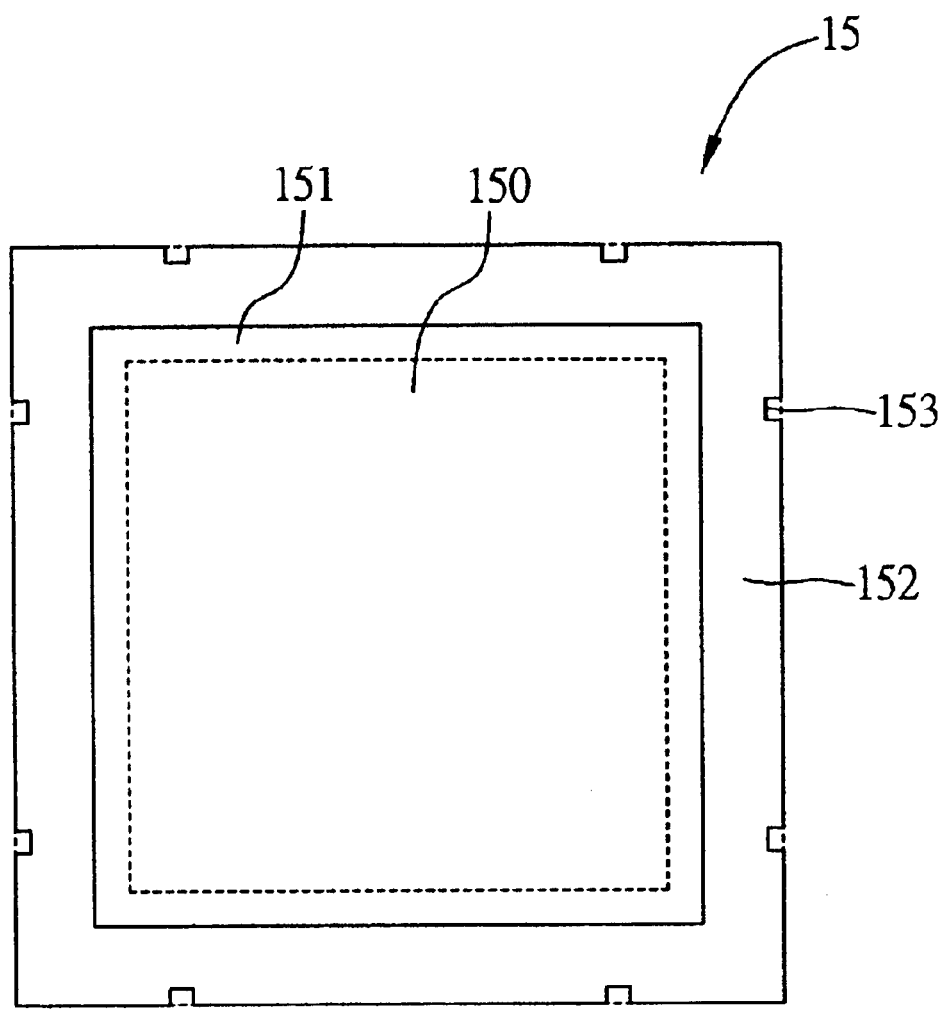
FIG. 2B is a top view of a heat sink used in the semiconductor package according to the invention.

A heat sink 15 is provided on the upper surface 100 of the substrate 10 and the non-active surface 111 of the chip 11 with the use of an adhesive (such as thermally conductive adhesive) 18 for attaching the heat sink 15 to the chip 11. The chip 11 and the passive component 14 are covered by the heat sink 15 to be protected against damage from external moisture and contaminant. As a result, heat produced from operation of the chip 11 can be dissipated via the thermally conductive adhesive 18 and the heat sink 15, thereby improving heat dissipating efficiency of the semiconductor package. The heat sink 15 has a flat portion 150 and a support portion 151 extending from an edge of the flat portion 150 to the substrate 10, making the flat portion 150 elevated above the chip 11 by the support portion 151. The support portion 151 is formed with a flange 152 in contact with the upper surface 100 of the substrate 10, and an edge of the flange 152 is flush with the edge of the substrate 10. As shown in FIG. 2B, an edge of the flange 152 of the heat sink 15 is formed with a plurality of inwardly recessed grooves 153 corresponding in position to the grooves 154 of the substrate 10.

Figure 2C:
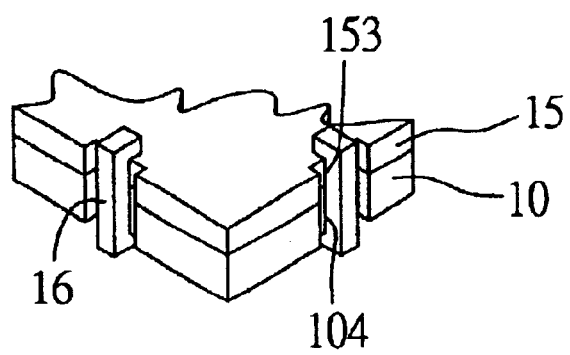
FIG. 2C is a perspective view showing the use of clip members to clamp the substrate and the heat sink in the semiconductor package according to the invention.

A plurality of clip members 16 made of a flexible material such as spring steel are prepared and used to clamp the flange 152 of the heat sink 15 and the substrate 10 so as to secure the heat sink 15 in position on the upper surface 100 of the substrate 10. Each of the clip members 16 has a recess portion 160 of a C or U shape, and the recess portion 160 is adapted to sufficiently accommodate the combined thickness of the heat sink 15 and the substrate 10, so as to allow the clip members 16 to be engaged with the grooves 153 of the heat sink 15 and the grooves 104 of the substrate 10 to thereby clamp the heat sink 15 and the substrate 10 (as shown in FIGS. 1 and 2C), such that the heat sink 15 can be firmly held in position on the substrate 10 by means of the clip members 16. The grooves 153 of the heat sink 15 and the grooves 104 of the substrate 10 preferably have a depth slightly larger than the thickness (e.g. 0.3–0.4 mm) of the clip members 16; this makes the clip members 16 not protrude out of the edges of the heat sink 15 and the substrate 10, thereby not affecting the size or profile of the semiconductor package.

A plurality of solder balls 17 are implanted at the ball pads 103 on the lower surface 101 of the substrate 10 and serve as input/output (I/O) connections to be electrically connected to an external device such as printed circuit board (not shown), whereby the chip 11 can be electrically coupled to the printed circuit board via the solder balls 17 and operate. This thereby completes fabrication of the semiconductor package according to the invention.

Second Preferred Embodiment

Figure 3:
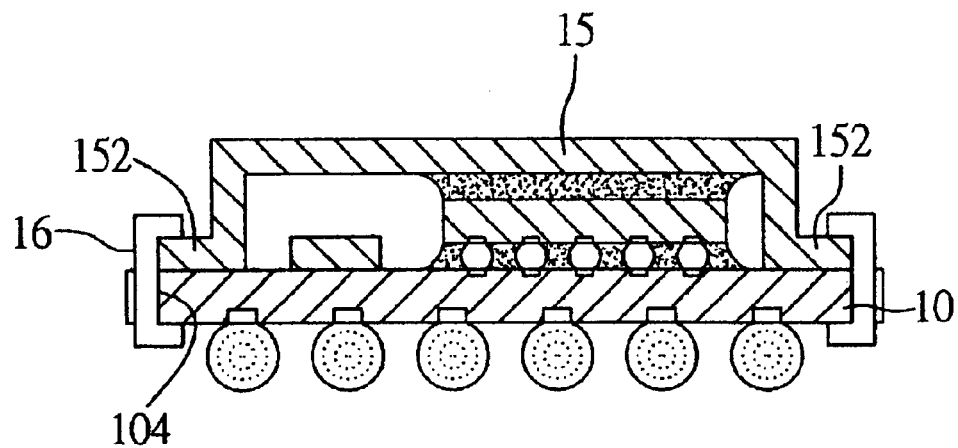
FIG. 3 is a cross-sectional view of the semiconductor package according to a second preferred embodiment of the invention.

FIG. 3 illustrates a semiconductor package according to a second preferred embodiment of the invention. As shown in the drawing, this semiconductor package is structurally similar to that of the first preferred embodiment, with the difference in that the flange 152 of the heat sink 15 is not formed with grooves; instead, coverage of the flange 152 is slightly smaller than that of the substrate 10, for example, the edge of the flange 152 being flush with dead ends of the grooves 104 of the substrate 10, such that the clip members 16 are engaged with the grooves 104 of the substrate 10 and clamp the heat sink 15 and the substrate 10.

Third Preferred Embodiment

Figure 4:
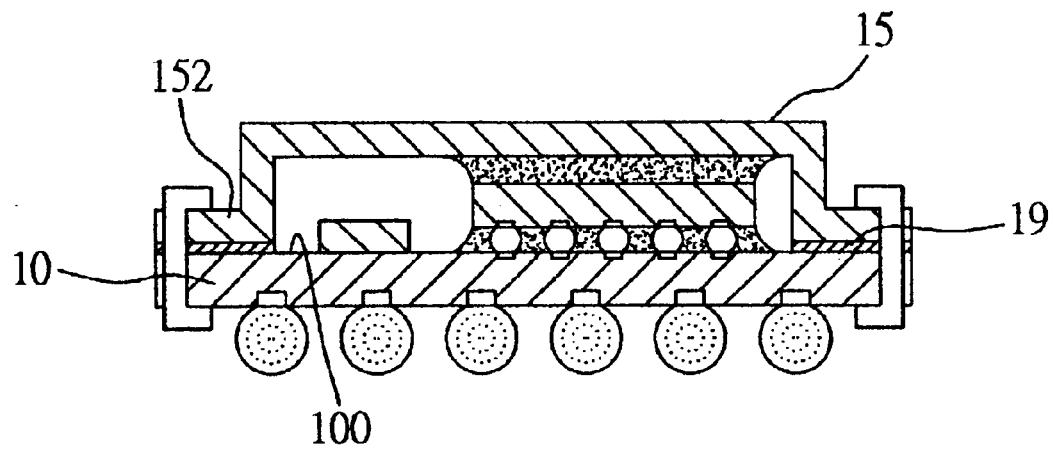
FIG. 4 is a cross-sectional view of the semiconductor package according to a third preferred embodiment of the invention.
Figure 5:
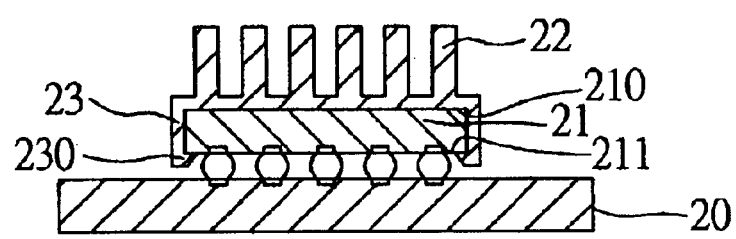
FIG. 5 (PRIOR ART) is a cross-sectional view of a conventional semiconductor package with a heat sink.

FIG. 4 illustrates a semiconductor package according to a third preferred embodiment of the invention. As shown in the drawing, this semiconductor package structurally differs from that of the first preferred embodiment in that the flange 152 of the heat sink 15 is attached to the upper surface 100 of the substrate 10 by means of an adhesive 19 so as to further firmly position the heat sink 15 on the substrate 10.

The above semiconductor package yields significant benefits in the use of a plurality of flexible clip members to clamp the substrate and the flange of the heat sink mounted on a surface of the substrate so as to secure the heat sink on the substrate in position. The edge of the substrate and/or the edge of the flange is formed with a plurality of grooves to be engaged with the clip members, such that the substrate and the heat sink can be clamped by the clip members. Moreover, the grooves of the substrate are preferably situated at positions corresponding to space between adjacent solder balls (implanted on a surface of the substrate opposite to the substrate mounted with the heat sink), thereby not affecting arrangement of the solder balls or ball pads (where the solder balls are bonded) on the substrate, and thus making the substrate capable of being mounted with a full array of solder balls. This method of positioning the heat sink on the substrate can eliminate chip cracks caused by directly coupling the heat sink onto the chip as in the prior art. Further, compared to the prior art of using fixing members (such as bolts) for attaching the heat sink to the substrate in which the heat sink and the substrate are formed with holes for being engaged with the fixing members, this feature of hole formation is not required in the semiconductor package according to the invention and thus trace routability on the substrate would not be affected. And, the grooves formed at the edge of the substrate only need to be dimensioned sufficiently to receive the clip members, thereby leading to much less damage to the substrate as compared to formation of holes on the substrate. In addition, the substrate free of holes can prevent damage from external moisture or contaminant entering into the holes and thereby eliminates the reliability issues to the semiconductor package.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package with a heat sink, comprising:

a substrate having an upper surface and a lower surface opposed to the upper surfaces, wherein an edge of the substrate is formed with a plurality of grooves penetrating through the upper and lower surfaces of the substrate;

at least one chip mounted on the upper surface of the substrate and electrically connected to the substrate by a plurality of conductive elements;

a heat sink mounted on the upper surface of the substrate and covering the chip, the heat sink having a flat portion and a support portion extending from an edge of the flat portion to the substrate, making the flat portion elevated above the chip by the support portion, wherein the support portion is formed with a flange in contact with the upper surface of the substrate;

a plurality of clip members each having a recess portion for receiving the flange of the heat sink and the substrate, and the flange of the heat sink and the substrate are clamped by the clip members such that a death of each of the grooves is larger than a thickness of each of the clip members, so as to firmly position the heat sink on the substrate; and a plurality of solder balls implanted on the lower surface of the substrate.

2. The semiconductor package of claim 1, further comprising: at least one passive component mounted on the upper surface of the substrate at area free of the chip and covered by the heat sink.

3. The semiconductor package of claim 1, wherein the grooves are situated at positions corresponding to space between adjacent solder balls.

4. The semiconductor package of claim 3, wherein a width of the groove is smaller than a distance between adjacent solder balls.

5. The semiconductor package of claim 1, wherein an edge of the flange of the heat sink is formed with a plurality of grooves corresponding in position to the grooves of the substrate, allowing the clip members to be engaged with the corresponding grooves of the heat sink and of the substrate to clamp the heat sink and the substrate.

6. The semiconductor package of claim 5, wherein the edge of the flange of the heat sink is flush with the edge of the substrate.

7. The semiconductor package of claim 1, wherein coverage of the flange of the heat sink is smaller than that of the substrate, allowing the clip members to be engaged with the grooves of the substrate and clamp the heat sink and the substrate.

8. The semiconductor package of claim 7, wherein an edge of the flange of the heat sink is flush with dead ends of the grooves of the substrate.

9. The semiconductor package of claim 1, wherein the clip members are made of flexible spring steel.

10. The semiconductor package of claim 1, wherein thickness of the clip members is 0.3–0.4 mm.

11. The semiconductor package of claim 1, wherein the heat sink is mounted on the substrate by means of an adhesive.

* * * * *